US007518908B2

(12) United States Patent
Maayan et al.

(10) Patent No.: US 7,518,908 B2
(45) **Date of Patent: *Apr. 14, 2009**

(54) EEPROM ARRAY AND METHOD FOR OPERATION THEREOF

(75) Inventors: Eduardo Maayan, Kfar Saba (IL); Ron Eliyahu, Herzelia (IL); Boaz Eitan, Ra'anana (IL)

(73) Assignee: Saifun Semiconductors Ltd., Netanya (IL)

( * ) Notice: Subject to any disclaimer, the term of this patent is extended or adjusted under 35 U.S.C. 154(b) by 0 days.

This patent is subject to a terminal disclaimer.

(21) Appl. No.: 10/155,215

(22) Filed: May 28, 2002

(65) Prior Publication Data

US 2003/0039153 A1 Feb. 27, 2003

Related U.S. Application Data

(63) Continuation of application No. 09/761,818, filed on Jan. 18, 2001, now Pat. No. 6,614,692.

(51) Int. Cl.
*G11C 16/04* (2006.01)

(52) U.S. Cl. ............................ 365/185.02; 365/185.03; 365/185.11; 365/185.16; 365/185.29

(58) Field of Classification Search ............ 365/185.28, 365/185.01, 185.03, 185.11, 185.16, 185.29, 365/185.02
See application file for complete search history.

(56) References Cited

U.S. PATENT DOCUMENTS 3,881,180 A 4/1975 Gosney, Jr.
3,895,360 A 7/1975 Cricchi et al.
3,952,325 A 4/1976 Beale et al.
4,016,588 A 4/1977 Ohya et al.
4,017,888 A 4/1977 Christie et al.
4,145,703 A 3/1979 Blanchard et al.
4,151,021 A 4/1979 McElroy
4,173,766 A 11/1979 Hayes
4,173,791 A 11/1979 Bell (Continued)

FOREIGN PATENT DOCUMENTS

EP 0693781 1/1996

(Continued)

OTHER PUBLICATIONS

Chan et al., "*A True Single-Transistor Oxide-Nitride-Oxide EEPROM Device,*" IEEE Electron Device Letters, vol. EDL-8, No. 3, Mar. 1987.

(Continued)

*Primary Examiner*—Hoai V Ho
(74) *Attorney, Agent, or Firm*—EMPK & Shiloh, LLP

(57) ABSTRACT

A method for operating an electrically erasable programmable read only memory (EEPROM) array includes providing an array including a multiplicity of memory cells, wherein each memory cell is connected to a word line and to two bit lines, selecting one of the memory cells, and erasing a bit of the selected memory cell while applying an inhibit word line voltage to a gate of an unselected memory cell. An EEPROM array is also described, the array including a multiplicity of NROM memory cells, wherein each memory cell is connected to a word line and to two bit lines, and wherein each NROM cell is individually erasable and individually programmable without significantly disturbing unselected cells.

22 Claims, 4 Drawing Sheets

U.S. PATENT DOCUMENTS 4,247,861 A 1/1981 Hsu et al.
4,257,832 A 3/1981 Schwabe et al.
4,281,397 A 7/1981 Neal et al.
4,306,353 A 12/1981 Jacobs et al.
4,342,102 A 7/1982 Puar
4,342,149 A 8/1982 Jacobs et al.
4,360,900 A 11/1982 Bate
4,373,248 A 2/1983 McElroy
4,380,057 A 4/1983 Kotecha et al.
4,388,705 A 6/1983 Sheppard
4,389,705 A 6/1983 Sheppard
4,435,786 A 3/1984 Tickle
4,448,400 A 5/1984 Harari
4,471,373 A 9/1984 Shimizu et al.
4,494,016 A 1/1985 Ransom et al.
4,507,673 A 3/1985 Aoyama et al.
4,521,796 A 6/1985 Rajkanan et al.
4,527,257 A 7/1985 Cricchi
4,586,163 A 4/1986 Koike
4,613,956 A 9/1986 Paterson et al.
4,630,085 A 12/1986 Koyama
4,663,645 A 5/1987 Komori et al.
4,665,426 A 5/1987 Allen et al.
4,667,217 A 5/1987 Janning
4,672,409 A 6/1987 Takei et al.
4,742,491 A 5/1988 Liang et al.
4,758,869 A 7/1988 Eitan et al.
4,760,555 A 7/1988 Gelsomini et al.
4,769,340 A 9/1988 Chang et al.
4,780,424 A 10/1988 Holler et al.
4,839,705 A 6/1989 Tigelaar et al.
4,847,808 A 7/1989 Kobatake
4,870,470 A 9/1989 Bass, Jr. et al.
4,916,671 A 4/1990 Ichiguchi
4,941,028 A 7/1990 Chen et al.
4,992,391 A 2/1991 Wang
5,021,999 A 6/1991 Kohda et al.
5,027,321 A 6/1991 Park
5,042,009 A 8/1991 Kazerounian et al.
5,075,245 A 12/1991 Woo et al.
5,086,325 A 2/1992 Schumann et al.
5,094,968 A 3/1992 Schumann et al.
5,104,819 A 4/1992 Freiberger et al.
5,117,389 A 5/1992 Yiu
5,120,672 A 6/1992 Mitchell et al.
5,159,570 A 10/1992 Mitchell et al.
5,168,334 A 12/1992 Mitchell et al.
5,172,338 A 12/1992 Mehrotra et al.
5,175,120 A 12/1992 Lee
5,204,835 A 4/1993 Eitan
5,214,303 A 5/1993 Aoki
5,241,497 A 8/1993 Komarek
5,260,593 A 11/1993 Lee
5,268,861 A 12/1993 Hotta
5,289,412 A 2/1994 Frary et al.
5,293,563 A 3/1994 Ohta
5,295,108 A 3/1994 Higa
5,305,262 A 4/1994 Yoneda
5,311,049 A 5/1994 Tsuruta
5,315,541 A 5/1994 Harari et al.
5,324,675 A 6/1994 Hayabuchi
5,334,555 A 8/1994 Sugiyama et al.
5,335,198 A 8/1994 Van Buskirk et al.
5,338,954 A 8/1994 Shimoji
5,345,425 A 9/1994 Shikatani
5,349,221 A 9/1994 Shimoji
5,350,710 A 9/1994 Hong et al.
5,352,620 A 10/1994 Komori et al.
5,357,134 A 10/1994 Shimoji
5,359,554 A 10/1994 Odake et al.
5,366,915 A 11/1994 Kodama
5,375,094 A 12/1994 Naruke
5,393,701 A 2/1995 Ko et al.
5,394,355 A 2/1995 Uramoto et al.
5,399,891 A 3/1995 Yiu et al.
5,400,286 A 3/1995 Chu et al.
5,402,374 A 3/1995 Tsuruta et al.
5,412,601 A 5/1995 Sawada et al.
5,414,693 A 5/1995 Ma et al.
5,418,176 A 5/1995 Yang et al.
5,418,743 A 5/1995 Tomioka et al.
5,422,844 A 6/1995 Wolstenholme et al.
5,424,567 A 6/1995 Chen
5,424,978 A 6/1995 Wada et al.
5,426,605 A 6/1995 Van Berkel et al.
5,434,825 A 7/1995 Harari
5,436,481 A 7/1995 Egawa et al.
5,440,505 A 8/1995 Fazio et al.
5,450,341 A 9/1995 Sawada et al.
5,450,354 A 9/1995 Sawada et al.
5,455,793 A 10/1995 Amin et al.
5,467,308 A 11/1995 Chang et al.
5,477,499 A 12/1995 Van Buskirk et al.
5,495,440 A 2/1996 Asakura
5,496,753 A 3/1996 Sakurai et al.
5,518,942 A 5/1996 Shrivastava
5,521,870 A 5/1996 Ishikawa
5,523,251 A 6/1996 Hong
5,523,972 A 6/1996 Rashid et al.
5,537,358 A 7/1996 Fong
5,553,018 A 9/1996 Wang et al.
5,563,823 A 10/1996 Yiu et al.
5,583,808 A 12/1996 Brahmbhatt
5,590,068 A 12/1996 Bergemont
5,592,417 A 1/1997 Mirabel
5,599,727 A 2/1997 Hakozaki et al.
5,606,523 A 2/1997 Mirabel
5,617,357 A 4/1997 Haddad et al.
5,623,438 A 4/1997 Guritz et al.
5,654,568 A 8/1997 Nakao
5,656,513 A 8/1997 Wang et al.
5,661,060 A 8/1997 Gill et al.
5,683,925 A 11/1997 Irani et al.
5,689,459 A 11/1997 Chang et al.
5,712,814 A 1/1998 Fratin et al.
5,712,815 A 1/1998 Bill et al.
5,715,193 A 2/1998 Norman
5,717,632 A 2/1998 Richart et al.
5,726,946 A 3/1998 Yamagata et al.
5,748,534 A 5/1998 Dunlap et al.
5,751,037 A 5/1998 Aozasa et al.
5,754,475 A 5/1998 Bill et al.
5,760,445 A 6/1998 Diaz
5,768,192 A * 6/1998 Eitan .................... 365/185.24
5,777,919 A 7/1998 Chi-Yung et al.
5,784,314 A 7/1998 Sali et al.
5,787,036 A 7/1998 Okazawa
5,793,079 A 8/1998 Georgescu et al.
5,796,657 A * 8/1998 Lee et al. ............... 365/185.11
5,801,076 A 9/1998 Ghneim et al.
5,812,449 A 9/1998 Song
5,812,456 A 9/1998 Hull et al.
5,812,457 A 9/1998 Arase
5,825,686 A 10/1998 Schmitt-Landsiedel et al.
5,828,601 A 10/1998 Hollmer et al.
5,834,851 A 11/1998 Ikeda et al.
5,836,772 A 11/1998 Chang et al.
5,841,700 A 11/1998 Chang
5,847,441 A 12/1998 Cutter et al.
5,862,076 A 1/1999 Eitan
5,864,164 A 1/1999 Wen
5,870,334 A 2/1999 Hemink et al.
5,870,335 A 2/1999 Khan et al.
5,877,537 A 3/1999 Aoki 5,886,927 A 3/1999 Takeuchi
5,896,340 A * 4/1999 Wong et al. ............ 365/230.03
5,909,618 A * 6/1999 Forbes et al. ................ 438/242
5,920,503 A 7/1999 Lee et al.
5,933,366 A 8/1999 Yoshikawa
5,933,367 A 8/1999 Matsuo et al.
5,936,888 A 8/1999 Sugawara
5,940,332 A 8/1999 Artieri
5,946,558 A 8/1999 Hsu
5,949,714 A 9/1999 Hemink et al.
5,949,728 A 9/1999 Liu et al.
5,963,412 A 10/1999 En
5,963,465 A 10/1999 Eitan
5,966,603 A 10/1999 Eitan
5,969,989 A 10/1999 Iwahashi
5,973,373 A 10/1999 Krautschneider et al.
5,986,940 A 11/1999 Atsumi et al.
5,990,526 A 11/1999 Bez et al.
5,991,202 A 11/1999 Derhacobian et al.
5,999,444 A 12/1999 Fujiwara et al.
5,999,494 A 12/1999 Holzrichter
6,011,725 A * 1/2000 Eitan ..................... 365/185.33
6,018,186 A 1/2000 Hsu
6,020,241 A 2/2000 You et al.
6,028,324 A 2/2000 Su et al.
6,030,871 A 2/2000 Eitan
6,034,403 A 3/2000 Wu
6,034,896 A 3/2000 Ranaweera et al.
6,037,627 A 3/2000 Kitamura et al.
6,044,022 A 3/2000 Nachumovsky
6,063,666 A 5/2000 Chang et al.
6,074,916 A 6/2000 Cappelletti
6,081,456 A 6/2000 Dadashev
6,084,794 A 7/2000 Lu et al.
6,108,240 A 8/2000 Lavi et al.
6,117,714 A 9/2000 Beatty
6,128,226 A 10/2000 Eitan et al.
6,133,095 A 10/2000 Eitan et al.
6,134,156 A 10/2000 Eitan
6,137,718 A 10/2000 Reisinger
6,147,904 A 11/2000 Liron
6,154,081 A 11/2000 Pakkala et al.
6,163,048 A 12/2000 Hirose et al.
6,175,523 B1 1/2001 Yang et al.
6,181,597 B1 1/2001 Nachumovsky
6,195,196 B1 2/2001 Kimura et al.
6,201,282 B1 3/2001 Eitan
6,201,737 B1 3/2001 Hollmer et al.
6,205,056 B1 3/2001 Pan et al.
6,208,557 B1 3/2001 Bergemont et al.
6,214,666 B1 4/2001 Mehta
6,215,148 B1 4/2001 Eitan
6,218,695 B1 * 4/2001 Nachumovsky ............. 257/296
6,222,762 B1 4/2001 Guterman et al.
6,222,768 B1 4/2001 Hollmer et al.
6,240,032 B1 5/2001 Fukumoto
6,248,633 B1 * 6/2001 Ogura et al. ................ 438/267
6,252,799 B1 6/2001 Liu et al.
6,256,231 B1 7/2001 Lavi et al.
6,261,904 B1 7/2001 Pham et al.
6,265,268 B1 7/2001 Halliyal et al.
6,272,047 B1 8/2001 Mihnea et al.
6,275,414 B1 8/2001 Randolph et al.
6,281,545 B1 8/2001 Liang et al.
6,282,145 B1 8/2001 Tran et al.
6,285,574 B1 9/2001 Eitan
6,285,589 B1 9/2001 Kajitani
6,287,917 B1 9/2001 Park et al.
6,297,096 B1 10/2001 Boaz
6,297,143 B1 10/2001 Foote et al.
6,304,485 B1 10/2001 Harari et al.
6,307,807 B1 10/2001 Sakui et al.
6,308,485 B1 10/2001 Blumenthal
6,326,265 B1 12/2001 Liu et al.
6,335,874 B1 1/2002 Eitan
6,337,502 B1 1/2002 Eitan et al.
6,339,556 B1 1/2002 Watanabe
6,346,442 B1 2/2002 Aloni et al.
6,348,381 B1 2/2002 Jong et al.
6,348,711 B1 2/2002 Eitan
6,349,062 B1 * 2/2002 Thurgate .............. 365/185.29
6,351,415 B1 2/2002 Kushnarenko
6,353,554 B1 3/2002 Banks
6,410,388 B1 6/2002 Kluth et al.
6,417,081 B1 7/2002 Thurgate
6,429,063 B1 8/2002 Eitan
6,436,766 B1 8/2002 Rangarajan et al.
6,436,768 B1 8/2002 Yang et al.
6,440,797 B1 8/2002 Wu et al.
6,445,030 B1 9/2002 Wu et al.
6,458,656 B1 10/2002 Park et al.
6,458,677 B1 10/2002 Hopper et al.
6,469,935 B2 10/2002 Hayashi
6,472,706 B2 10/2002 Widdershoven et al.
6,490,204 B2 12/2002 Bloom et al.
6,496,414 B2 12/2002 Kasa et al.
6,528,390 B2 3/2003 Komori et al.
6,532,173 B2 3/2003 Iioka et al.
6,537,881 B1 3/2003 Rangarajan et al.
6,538,270 B1 3/2003 Randolph et al.
6,541,816 B2 4/2003 Ramsbey et al.
6,552,387 B1 4/2003 Eitan
6,555,436 B2 4/2003 Ramsbey et al.
6,559,500 B2 5/2003 Torii
6,562,683 B1 5/2003 Wang et al.
6,566,194 B1 5/2003 Ramsbey et al.
6,566,699 B2 5/2003 Eitan
6,570,211 B1 5/2003 He et al.
6,583,005 B2 6/2003 Hashimoto et al.
6,583,479 B1 6/2003 Fastow et al.
6,593,606 B1 7/2003 Randolph et al.
6,614,692 B2 9/2003 Eliyahu et al.
6,617,179 B1 9/2003 Kim
6,617,215 B1 9/2003 Halliyal et al.
6,627,555 B2 9/2003 Eitan et al.
6,630,384 B1 10/2003 Sun et al.
6,633,496 B2 10/2003 Maayan et al.
6,633,499 B1 10/2003 Eitan et al.
6,639,271 B1 10/2003 Zheng et al.
6,642,148 B1 11/2003 Ghandehari et al.
6,642,573 B1 11/2003 Halliyal et al.
6,642,586 B2 11/2003 Takahashi
6,645,801 B1 11/2003 Ramsbey et al.
6,653,191 B1 11/2003 Yang et al.
6,664,588 B2 12/2003 Eitan
6,674,138 B1 1/2004 Halliyal et al.
6,680,509 B1 1/2004 Wu et al.
6,768,165 B1 7/2004 Eitan
2002/0004878 A1 1/2002 Norman
2002/0034097 A1 3/2002 Banks
2002/0064911 A1 5/2002 Eitan
2002/0132436 A1 9/2002 Eliyahu et al.
2002/0191465 A1 12/2002 Maayan et al.
2003/0001213 A1 1/2003 Lai
2003/0117841 A1 6/2003 Yamashita
2003/0117861 A1 6/2003 Maayan et al.
2003/0134476 A1 7/2003 Roizin et al.
2003/0142544 A1 7/2003 Maayan et al.
2003/0190786 A1 10/2003 Ramsbey et al.
2003/0197221 A1 10/2003 Shinozaki et al.
2003/0206435 A1 11/2003 Takahashi
2003/0209767 A1 11/2003 Takahashi et al.
2003/0214844 A1 11/2003 Iijima
2003/0218207 A1 11/2003 Hashimoto et al.
2003/0222303 A1 12/2003 Fukuda et al.
2004/0008541 A1 1/2004 Maayan et al.

2004/0014290 A1 1/2004 Yang et al.
2004/0021172 A1 2/2004 Zheng et al.
2004/0027858 A1 2/2004 Takahashi et al.

FOREIGN PATENT DOCUMENTS

| | | |
|---|---|---|
| EP | 0751560 | 1/1997 |
| EP | 1073120 | 1/2001 |
| EP | 1 091 418 | 4/2001 |
| EP | 1126468 | 8/2001 |
| EP | 0 822 557 | 9/2001 |
| EP | 1 207 552 | 5/2002 |
| EP | 1223586 | 7/2002 |
| EP | 0 656 628 | 4/2003 |
| EP | 1 365 452 | 11/2003 |
| GB | 1297899 | 11/1972 |
| GB | 2157489 | 10/1985 |
| JP | 4226071 | 8/1992 |
| JP | 04226071 | 8/1992 |
| JP | 04291962 | 10/1992 |
| JP | 05021758 | 1/1993 |
| JP | 06-111592 | 4/1994 |
| JP | 06-349289 | 12/1994 |
| JP | 07193151 | 7/1995 |
| JP | 408106791 | 4/1996 |
| JP | 08-153396 | 6/1996 |
| JP | 408297988 | 11/1996 |
| JP | 409017981 | 1/1997 |
| JP | 09-115291 | 5/1997 |
| JP | 09-153559 | 6/1997 |
| JP | 09162314 | 6/1997 |
| JP | 09-259594 | 10/1997 |
| JP | 11162182 | 6/1999 |
| JP | 411354758 | 12/1999 |
| JP | 2000-068483 | 3/2000 |
| JP | 02001085646 | 3/2001 |
| JP | 2001118392 | 4/2001 |
| JP | 02002216488 | 8/2002 |
| WO | WO 81/00790 | 3/1981 |
| WO | WO 96/15553 | 5/1996 |
| WO | WO 96/25741 | 8/1996 |
| WO | WO 98/03977 | 1/1998 |
| WO | WO 99/31670 | 6/1999 |
| WO | WO 99/57728 | 11/1999 |
| WO | WO 03/032393 | 4/2003 |
| WO | WO 03/054964 | 7/2003 |
| WO | WO 03/079446 | 9/2003 |
| WO | WO 03/083916 | 10/2003 |
| WO | WO 03/088259 | 10/2003 |
| WO | WO 03/088353 | 10/2003 |

OTHER PUBLICATIONS

Eitan et al., "*Hot-Electron Injection into the Oxide in n-Channel MOS Devices,*" IEEE Transactions on Electron Devices, vol. ED-38, No. 3, pp. 328-340, Mar. 1981.

Roy, Anirban "*Characterization and Modeling of Charge Trapping and Retention in Novel Multi-Dielectic Nonvolatile Semiconductor Memory Device,*" Doctoral Dissertation, Sherman Fairchild Center, Department of Computer Science and Electrical Engineering, pp. 1-35, 1989.

"*2 Bit/Cell EEPROM Cell Using Band-To-Band Tunneling For Data Read-Out,*" IBM Technical Disclosure Bulletin, US IBM Corp. NY vol. 35, No. 4B, ISSN: 0018-88689, Sep. 1992.

Hsing-Huang Tsent et al. "*Thin CVD Gate Dielectric for USLI Technology*", IEEE, 0-7803-1450-6, 1993.

Pickar, K.A., "*Ion Implementation in Silicon,*" Applied Solid State Science, vol. 5, R. Wolfe Edition, Academic Press, New York, 1975.

Bruno Ricco, "*Nonvolatile Multilevel Memories for Digital Application*", IEEE, vol. 86, No. 12, issued Dec. 1998, pp. 2399-2421.

Chang, J., "*Non Vollatile Semiconductor Memory Devices,*" Proceeding of the IEEE, vol. 64 No. 7, Issued Jul. 1976.

Ma et al., "*A dual-bit Split-Gate EEPROM (DSG) Cell in Contactless Array for Single-Vcc High Density Flash Memories*", IEEE, pp. 3.5.1-3.5.4, 1994.

Oshima et al., "*Process and Device Technologies for 16Mbit Eproms with Large-Tilt-Angle Implemented P-Pocket Cell,*" IEEE, CH2865-4/90/0000-0095, pp. 5.2.1-5.2.4, 1990.

Lee, H., "*A New Approach For the Floating-Gate MOS NonVolatile Memory*", Applied Physics Letters, vol. 31, No. 7, pp. 475-476, Oct. 1977.

Bhattacharyya et al., "*FET Gate Structure for Nonvolatile N-Channel Read-Mostly Memory Devices,*" IBM Technical Disclosure Bulletin, US IBM Corp. vol. 18, No. 6, p. 1768, 1976.

Bude et al., "*Secondary Electron Flash—a High Performance, Low Power Flash Technology for 0.35 μm and Below*", IEDM 97, pp. 279-282.

Bude et al., "*Modeling Nonequilibrium Hot Carrier Device Effects*", Conferences of Insulator Specialists of Europe, Sweden, Jun. 1997.

Glasser et al., "*The Design and Analysis of VLSI Circuits*", Addison Wesley Publishing Co, Chapter 2, 1988.

Jung et al., "*A 117-mm$^2$ 3.3V Only 128-Mb Multilevel NAND Flash Memory for Mass Storage Applications*" IEEE Journal of Solid-State Circuits, vol. 31, No. 11, Nov. 1996, pp. 1575-1583.

Campardo et al., "*40mm$^2$ 3-V-Only 50 MHz 64-Mb 2-b/cell CHE NOR Flash Memory*", IEEE Journal of Solid-State Circuits, vol. 35, No. 11, Nov. 2000, pp. 1655-1667.

Lin et al., "*Novel Source-Controlled Self-Verified Programming for Multilevel EEPROM's*", IEEE Transactions on Electron Devices, vol. 47, No. 6, Jun. 2000, pp. 1166-1174.

Eitan, U.S. Appl. No. 08/905,286, filed Aug. 1, 1997.

Eitan, U.S. Appl. No. 09/536,125, filed Mar. 28, 2000.

Eitan, U.S. Appl. No. 08/902,890, filed Jul. 30, 1997.

U.S. Appl. No. 08/902,890, filed Jul. 30, 1997, Eitan.

U.S. Appl. No. 08/905,286, filed Aug. 1, 1997, Eitan.

Bude et al., "Secondary Electron Flash—a High Performance, Low Power Flash Technology for 0.35 um and below", IEDM, 1997, pp. 279-282.

Bude et al., "Modeling Nonequilibrium Hot Carrier Device Effects", Conference of Insulator Specialists of Europe, Jun. 1997.

Jung et al., "A 117-mm$^2$ 3.3-V Only 128-Mb Multilevel NAND Flash Memory for Mass Storage Applications", IEEE Journal of Solid-State Circuits, Nov. 1996, pp. 1575-1583, vol. 31, No. 11.

Campardo et al., "40-mm$^2$ 3-V-Only 50-MHz 64-Mb 2-b/cell CHE NOR Flash Memory", IEEE Journal of Solid-State Circuits, Nov. 2000, pp. 1655-1667, vol. 35, No. 11.

Lin et al., "Novel Source-Controlled Self-Verified Programming for Multilevel EEPROM's", IEEE Transactions on Electron Devices, Jun. 2000, pp. 1166-1174, vol. 47, No. 6.

Chan et al., "A True Single-Transistor Oxide-Nitride-Oxide EEPROM Device", IEEE Electron Device Letters, Mar. 1987, vol. EDL-8, No. 3.

Eitan et al., "Hot-Electron Injection into the Oxide in n-Channel MOS Devices", IEEE Transactions on Electron Devices, Mar. 1981, vol. ED-28, No. 3.

Roy Anirban, "Characterization and Modeling of Charge Trapping and Retention in Novel Multi-Dielectric Nonvolatile Semiconductor Memory Devices", Microelectronics Laboratory, 1989.

Chang, "Nonvolatile Semiconductor Memory Devices", Proceedings of the IEEE, Jul. 1976, pp. 1039-1059, vol. 64, No. 7.

Ma et al., "A Dual-bit Split-Gate EEPROM (DSG) Cell in Contactless Array for Single-Vcc High Density Flash Memories", IEEE, 1994, pp. 57-60.

Oshima et al., "Process and Device Technologies for 16Mbit EPROMs with Large-Tilt-Angle Implanted P-Pocket Cell", IEEE, Dec. 1990, pp. 95-98.

Lee, "A New Approach for the Floating-Gate MOS Nonvolatile Memory", Applied Physics Letters, Oct. 1977, pp. 475-476, vol. 31, No. 7.

Glasser et al., "MOS Device Electronics", The Design and Analysis of VLSI Circuits, pp. 67-163.

Bhattacharyya et al., "FET Gate Structure for Nonvolatile N-Channel Read-Mostly Memory Device", IBM Technical Disclosure Bulletin, Nov. 1975, pp. 1768, vol. 18, No. 6.

Ricco et al., "Nonvolatile Multilevel Memories for Digital Applications", Proceedings of the IEEE, Dec. 1998, pp. 2399-2421, vol. 86, No. 12.
Tsent et al., Thin CVD Stacked Gate Dielectric for ULSI Technology, IEEE, 1993, pp. 13.1.1-13.1.4.
Pickar, "Ion Implementation is Silicon—Physics, Processing, and Microelectronic Devices", Applied Solid State Science, 1975, pp. 151-241, vol. 5.
"2 Bit/Cell EEPROM Cell Using Band-To-Band Tunneling for Data Read-Out", IBM Technical Disclosure Bulletin, 1992, pp. 136-140, vol. 35 No. 4B.
Umezawa, et al., "A 5-V-Only Operation 0.6-μm Flash EEPROM with Row Decoder Scheme in Triple-Well Structure", IEEE Journal of Solid-State Circuits, 1992, pp. 1540, vol. 27.
Mitchell, et al., "A New Self-Aligned Planar Array Cell for Ultra High Density EPROMS", 1987.
Esquivel, et al., "High Density Contactless, Self Aligned EPROM Cell Array Technology", 1986.
Sze, "P-N Junction Diode", Physics of Semiconductor Devices, 1981, Ch. 2.
Yoon, Sukyoon, et al., "A Novel Substrate Hot Electron and Hole Injection Structure with a Double-Implanted Buried-Channel MOSFET", IEEE Transactions on Electron Devices, Dec. 1991, pp. 2722, vol. 38, No. 12.
"4 Bits of Digital Data Fit in a Single Cell", Technology Newsletter, Electronic Design, Apr. 1, 1996.

* cited by examiner

EEPROM ARRAY AND METHOD FOR OPERATION THEREOF

CROSS REFERENCE TO RELATED APPLICATIONS

The present application is a continuation application of U.S. Ser. No. 09/761,818, filed Jan. 18, 2001, and issued as U.S. Pat. No. 6,614,692 on Sep. 2, 2003, which application is incorporated herein by reference.

FIELD OF THE INVENTION

The present invention relates generally to electrically erasable, programmable read only memory (EEPROM) arrays and methods for operation thereof, and more particularly, to nitride read only memory (NROM) EEPROM arrays and inhibiting disturbs in such arrays.

BACKGROUND OF THE INVENTION

EEPROM arrays are utilized for storage of data Typically, the data stored therein can be changed, either by programming or erasing, multiple times over the lifetime of the array. As in all non-volatile memory arrays, each cell is individually programmed; however, in contrast to either erasable, programmable read only memory (EPROM) or FLASH arrays, in EEPROM arrays each cell can also be individually erased.

Typical memory uses a single bit per cell, wherein electrical charge is stored on the floating gate of each cell. Within each cell, two possible voltage levels exist. The levels are controlled by the amount of charge that is stored on the floating gate; if the amount of charge on the floating gate is above a certain reference level, the cell is considered to be in a different level. Accordingly, each cell is characterized by a specific threshold voltage ($V_t$). Programming the cell increases threshold voltage $V_t$, whereas erasing the cell decreases threshold voltage $V_t$.

Non-volatile memory arrays comprise rows and columns of memory cells connected to word lines (rows of the array) and bit lines (columns). Each memory cell is connected to one word line and at least one bit line. Another terminal of the memory cell is connected either to another bit line (in which case, one of the bit lines is called the drain line and the other is the source line), or to a common line, such as a common source ground, depending on the array architecture. Programming or erasing an individual cell requires application of certain voltages to the word line and bit lines.

Generally, when programming or erasing a cell, one or more of the neighboring cells may also be affected by the programming/erasing operation, causing thereto a possible change in their threshold voltage. This unwanted change in threshold voltage of unselected cells is known in the art as the disturb problem, herein a “disturb”. A similar effect also occurs during a read operation. However, due to the relative weakness of the applied voltage levels, the effect is significantly smaller.

A standard prior art solution to the disturb problem in EEPROM arrays is to use two transistors per memory bit of the array, i.e., in addition to the memory transistor, a select transistor is also incorporated per cell. The select transistor usually disconnects the drain of the unselected memory transistors from the drain voltages used in the programming/erasing operations. The use of a select transistor per cell, however, significantly increases the area of the memory array.

SUMMARY OF THE INVENTION

The present invention seeks to solve the abovementioned disturb problem. In the present invention, an unselected memory cell that can experience a possible drop in threshold voltage is inhibited from being erased by application of an inhibit word line voltage to the gate of the unselected cell. The term “inhibiting” as used throughout the specification and claims refers to reducing, minimizing or even eliminating the disturb effect.

The magnitude of the gate voltage is selected such that the difference between the drain or source and gate voltages applied to the unselected cell is sufficiently small so that the threshold voltage of the unselected cell does not drop below a predetermined value. By application of the inhibit voltage, it is possible to achieve negligible erasure of the unselected cell, even during relatively long erasure times and multitudes of selected cell accesses.

In a virtual ground array, the application of a relatively high voltage to the word line of a selected cell being programmed may cause a voltage propagation along unselected bit lines, thereby turning on the cells along the unselected bit lines. In accordance with a preferred embodiment of the present invention, the voltage propagation is blocked by isolation zones positioned alongside bit lines. The isolation zones may be positioned so as to isolate a single column of memory cells or a slice of a plurality of columns.

In accordance with a preferred embodiment of the present invention, the EEPROM array comprises nitride read only memory (NROM) cells. Each NROM cell is individually erasable and individually programmable without significantly disturbing unselected cells, by using inhibit voltages as described hereinbelow.

There is thus provided in accordance with a preferred embodiment of the present invention, a method for operating an electrically erasable programmable read only memory (EEPROM) array. The method includes providing an array which has a multiplicity of memory cells, wherein each memory cell is connected to a word line and to two bit lines, one of the bit lines serving as a source and the other bit line serving as a drain, selecting one of the memory cells, and erasing a bit of the selected memory cell, while applying an inhibit word line voltage to a gate of an unselected memory cell.

In accordance with a preferred embodiment of the present invention the memory cells are non-floating gate memory cells.

Further in accordance with a preferred embodiment of the present invention the memory cells are nitride read only memory (NROM) cells. The NROM cells may be single bit, or alternatively, they may have more than one bit.

Still further in accordance with a preferred embodiment of the present invention the array is a virtual ground array.

The unselected memory cell may or may not share the same bit line as the selected cell.

In accordance with a preferred embodiment of the present invention the inhibit gate voltage is of such magnitude that a threshold voltage of the unselected memory cell is lowered not more than a predetermined amount.

Further in accordance with a preferred embodiment of the present invention the erasing includes applying to the selected memory cell a negative gate voltage, a positive drain voltage and a floating source voltage.

Still further, in accordance with a preferred embodiment of the present invention, at least one column of the memory cells is placed between a pair of isolation zones, the isolation zones defining therebetween a slice of word lines and bit lines.

There is also provided in accordance with a preferred embodiment of the present invention a method for operating an EEPROM array, the method including providing an array including a multiplicity of NROM cells, wherein each memory cell is connected to a word line and to two bit lines, one of the bit lines serving as a source and the other bit line serving as a drain, selecting one of the memory cells, and performing an operation on a bit of the selected memory cell, the operation including at least one of programming and erasing, while applying an inhibit word line voltage to a gate of an unselected memory cell.

There is also provided in accordance with a preferred embodiment of the present invention an EEPROM array, the array including a multiplicity of NROM memory cells, wherein each memory cell is connected to a word line and to two bit lines, wherein each NROM cell is individually erasable and individually programmable without significantly disturbing unselected cells. In contrast to the prior art, there is no need for a select transistor for each bit or cell.

BRIEF DESCRIPTION OF THE DRAWINGS

The present invention will be understood and appreciated more fully from the following detailed description taken in conjunction with the appended drawings in which.

DETAILED DESCRIPTION OF THE PRESENT INVENTION

Figure 1:
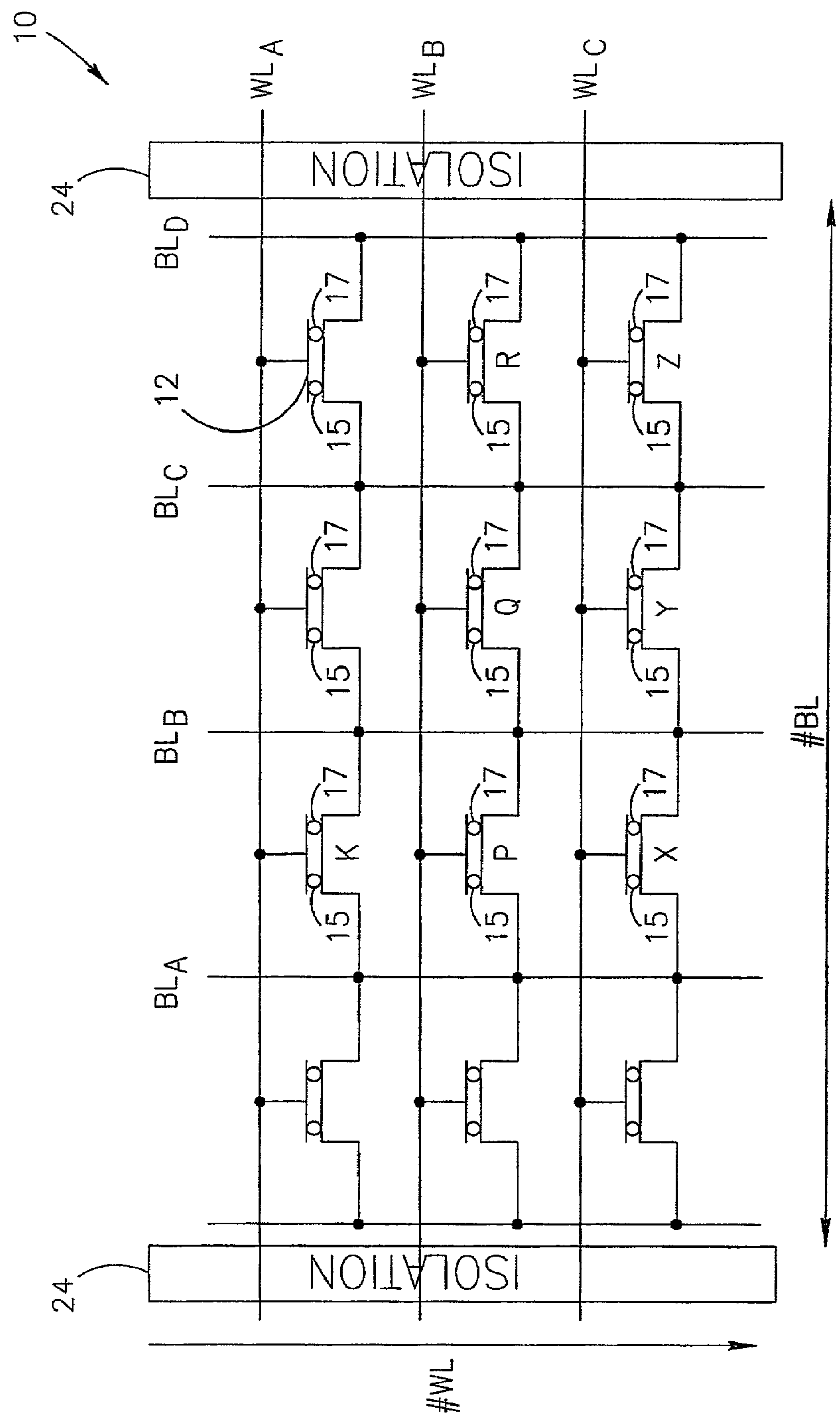
FIG. 1 is a schematic illustration of an EEPROM array of virtual ground NROM memory cells, constructed and operative in accordance with a preferred embodiment of the present invention.

Reference is now made to FIG. 1 which illustrates an EEPROM array 10 constructed and operative in accordance with a preferred embodiment of the present invention. Array 10 comprises a multiplicity of memory cells 12 each connected to an associated word line, generally designated WL, and two bit lines, generally designated BL. For purposes of the following explanation, memory cells 12 are labeled K, P, Q, R, X, Y and Z, respectively. In FIG. 1, memory cells P, Q and R, share the same word line $WL_B$. Cells K, P, X, Q and Y share the same bit line $BL_B$. Cell Z is connected to word line $WL_C$ and bit lines $BL_C$ and $BL_D$.

In accordance with a preferred embodiment of the present invention, memory cells 12 are nitride read only memory (NROM) cells. NROM cells are described in various publications, such as U.S. patent applications Ser. Nos. 08/902,890 and 08/905,286, assigned to the common assignee of the present invention, the disclosure of which is incorporated herein by reference. U.S. patent applications Ser. Nos. 08/902,890 and 08/905,286 describe, inter alia, the steps of programming, reading and erasing NROM cells. NROM cells have not heretofore been used in EEPROM arrays. The present invention enables individually accessing NROM cells in such an EEPROM array, and inhibiting program and erase disturbs in the array.

NROM cells may be single bit. Alternatively, they may have more than one bit, wherein two individual bits, a left-side bit 15 and a right-side bit 17, are stored in physically different areas of the charge-trapping region. Each bit may be single level or multi-level, i.e., may be programmed to different voltage levels.

If it is desired to program right-side bit 17, then the bit line closest to right-side bit 17 (e.g., $BL_B$ for cell P) is the drain and the bit line on the other side (e.g., $BL_A$ for cell P) is the source. When programming right-side bit 17, channel hot electrons are used to inject electrons in a lumped pocket close to the drain side of the cell. The electrons are located in localized states in the nitride layer. In order to program left-side bit 15 of the cell, one simply reverses the role of drain and source during programming.

The discussion follows hereinbelow with reference to a two-bit NROM cell. However, it is readily appreciated by those skilled in the art, that the invention is applicable for single and multi-bit cells as well.

If it is desired to program right-side bit 17 of memory cell P, a gate voltage $V_g$ (typically in the range of approximately 7-10V, e.g., 9V) is applied to word line $WL_B$, a drain voltage $V_d$ (typically in the range of approximately 4-5V, e.g. 4.5V) is applied to bit line $BL_B$, and bit line $BL_A$ is grounded (0V). All other bit lines are preferably floated near ground prior to any operation (programming or erasing). All other word lines are grounded. The right-side bits 17 of unselected cells K and X, and left-side bit 15 of cell Y share the same bit line $BL_B$ as cell P, and also receive drain voltage $V_d$. Since the gate voltage of cells K, X and Y is zero, these bits experience a lowering of the threshold voltage. In other words, as a consequence of programming right-side bit 17 of cell P, right-side bits 17 of unselected cells K and X, and left-side bit 15 of cell Y undergo partial erasure.

Unselected cell Z does not share the same bit line $BL_B$ or the same word line $WL_B$ as cell P. However, the application of the positive gate voltage to word line $WL_B$ causes some current flow towards the right side of array 10, until the bit lines towards the right of bit line $BL_B$ attain a drain voltage close to $V_d$. (This phenomenon is herein referred to as "high voltage propagation".) The result is that both bits of unselected cell Z receive a zero gate voltage and a positive drain voltage, thereby lowering their threshold voltage. In other words, as a consequence of programming right-side bit 17 of cell P, both the left-side and right-side bits 15 and 17 of cell Z undergo partial erasure. The same holds true for right-side bit 17 of cell Y, as well as other similarly positioned bits in EEPROM array 10.

Fortunately, however, the duration of programming is typically in the range of approximately 1-10 μsec. Since this programming time is relatively short, the right-side bits 17 of cells K and X, and both bits of cells Y and Z are only slightly erased for each programming operation on right-side bit 17 of cell P. The fact that the gate voltage of cells K, X, Y and Z is only zero and not negative, also minimizes the extent of erasure of these bits.

In order to contain and control the voltage propagation due to the application of the programming voltage, memory cells 12 are preferably placed between a pair of isolation zones 24. The isolation zones 24 define therebetween a slice of word lines and bit lines. There is no voltage propagation past isolation zones 24. Depending on the array design and voltages used, the isolation zones 24 can divide the array into slices of just one column or a plurality of columns.

Unselected cells Q and R share the same word line $WL_B$ as cell P, and also receive the positive gate voltage $V_g$. Therefore, there is virtually no effect on the threshold voltages of both bits of cells Q and R, since the bit lines on either side of cells Q and R are relatively high.

All the bit lines to the left of bit line $BL_A$ are floated near ground, and thus there is virtually no effect on the threshold voltage of the bits of cells on those bit lines.

Table A summarizes the disturb on unselected cells due to programming right-side bit 17 of cell P:

TABLE A

| Cell | Bit | $V_g$ | $V_d$ | $V_s$ | Effect on $V_t$ |
|---|---|---|---|---|---|
| P | Right | 9 | 4.5 | 0 | Program |
| K | Right | 0 | 4.5 | 0 | Partial Erase |
| Q | Left | 9 | 4.5 | 4.5 | Virtually None |
| Q | Right | 9 | 4.5 | 4.5 | Virtually None |
| R | Both | 9 | 4.5 | 4.5 | Virtually None |
| X | Right | 0 | 4.5 | 0 | Partial Erase |
| Y | Left | 0 | 4.5 | 4.5 | Partial Erase |
| Y | Right | 0 | 4.5 | 4.5 | Partial Erase |
| Z | Both | 0 | 4.5 | 4.5 | Partial Erase |

If it is desired to erase right-side bit 17 of memory cell P, a negative gate voltage $V_g$ (such as approximately in the range of −5 to −7V) is applied to word line $WL_B$, a positive drain voltage $V_d$ (typically in the range of approximately 3-5V, e.g. 4V) is applied to bit line $BL_B$, and bit line $BL_A$ is floating (or driven). Left-side bit 15 of cell Q receives the exact same gate, drain and source voltages. This means that left-side bit 15 of cell Q is also erased together with right-side bit 17 of cell P. Accordingly, after an erasure of right-side bit 17 of cell P, left-side bit 15 of cell Q must be re-programmed to its original value. This is the case for a two-bit NROM cell. For single bit operation, it is preferable to arrange the bits so that they do not share a common bit line. In such an arrangement, no neighboring bit would be erased upon erasure of right-side bit 17 of cell P, for example.

Right-side bit 17 of cell Q and both bits of cell R share the same word line $WL_B$ as cell P, and also receive the negative gate voltage $V_g$. Since there is only a negative gate voltage applied to word line $WL_B$ and the other word lines are grounded, and the bit lines on either side of cells Q and R are floated near ground prior to erasure of right-side bit 17 of cell P, there is no voltage propagation to the other cells and there is negligible erasure of right-side bit 17 of cell Q and both bits of cell R.

The right-side bits 17 of unselected cells K and X, and left-side bit 15 of cell Y share the same bit line $BL_B$ as cell P, and also receive drain voltage $V_d$. Since the gate voltage of cells K, X and Y is zero, right-side bits 17 of unselected cells K and X, and left-side bit 15 of cell Y experience a lowering of the threshold voltage. In other words, as a consequence of erasing cell P, right-side bits 17 of cells K and X, and left-side bit 15 of cell Y undergo partial erasure. Unfortunately, the duration of erasing is typically in the range of approximately 10 μsec-10 msec. After many cycles, the accumulated erasure of the unselected cells may be intolerably significant. Unselected cell Z does not share the same bit line $BL_B$ or the same word line $WL_B$ as cell P, and there is virtually no effect on its threshold voltage. The same holds true for right-side bit 17 of cell Y.

Table B summarizes the disturb effects on unselected cells due to erasing right-side bit 17 of cell P:

TABLE B

| Cell | Bit | $V_g$ | $V_d$ | $V_s$ | Effect on $V_t$ |
|---|---|---|---|---|---|
| P | Right | −7 | 4 | Float | Erase |
| K | Right | 0 | 4 | Float | Partial Erase |
| Q | Left | −7 | 4 | Float | Erase |
| Q | Right | −7 | Float | Float | Virtually None |
| R | Both | −7 | Float | Float | Virtually None |
| X | Right | 0 | 4 | Float | Partial Erase |
| Y | Left | 0 | 4 | Float | Partial Erase |
| Y | Right | 0 | Float | Float | Virtually None |
| Z | Both | 0 | Float | Float | Virtually None |

Figure 2:
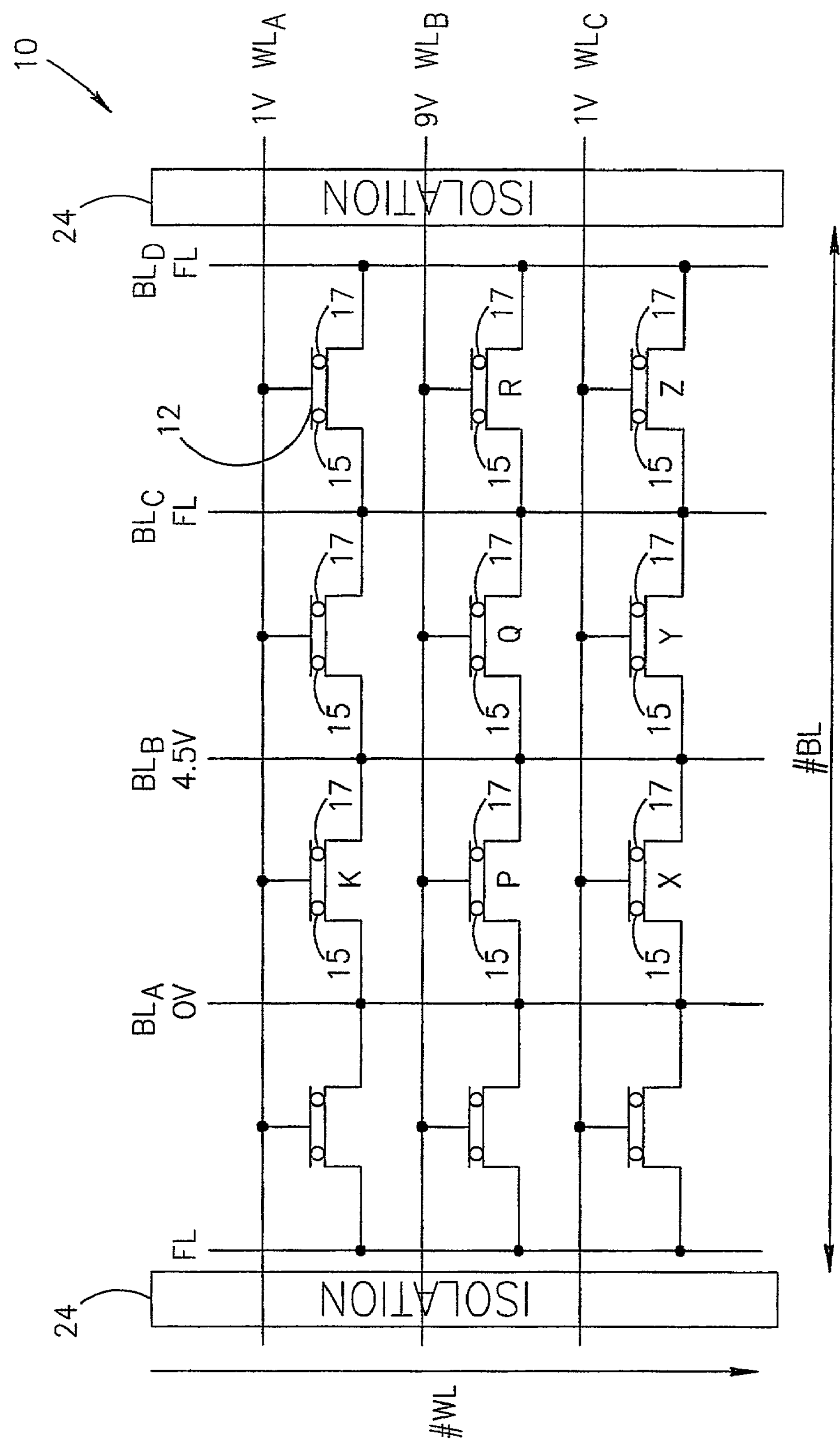
FIGS. 2 and 3 are schematic illustrations of the EEPROM array of FIGS. 1 and 2, showing the application of an inhibit voltage during program and erase operations, respectively, in accordance with a preferred embodiment of the present invention.

In accordance with a preferred embodiment of the present invention, disturb of the unselected cells during programming or erasing of a selected memory cell is inhibited by applying a voltage to the word line of the unselected cell. FIG. 2 illustrates one example of the invention during programming right-side bit 17 of cell P. A gate voltage $V_g$ of 9V is applied to word line $WL_B$, a drain voltage $V_d$ of 4.5V is applied to bit line $BL_B$, and bit line $BL_A$ is grounded (0V). The remaining bit lines are floated near ground before programming.

In order to inhibit lowering of the threshold voltage of right-side bit 17 of cell K, an d both bits of cells X and Y, a positive gate voltage is applied to word lines $WL_A$ (of cell K) and $WL_C$ (of cells X and Y). The magnitude of the required inhibit voltage is a function of a number of variables, such as, but not limited to, programming time, drain voltage applied to the bit line of the programmed cell, voltage difference between gate and drain voltages applied to the programmed cell, and what is considered a tolerable drop in the threshold voltage of the unselected cell. The tolerable drop in the threshold voltage is further described hereinbelow with reference to FIG. 4. In general, the inhibit voltage should be low enough so as not to program unselected bits, and so as not to cause any significant leakage current, but high enough so that the threshold voltages of unselected memory cells are lowered not more than a predetermined amount (over time or after a predetermined amount of operations). Row and column decoders (not shown) may be used to provide the voltage levels necessary for inhibiting the disturb problem. Such decoders are known in the art and persons skilled in the art may design decoders in accordance with the principles outlined herein.

For the purposes of example only, in the case of $V_g$=9V, $V_d$=4.5V, and a programming time of 4 μsec, it has been found that an inhibit voltage in the range of 0-2.5V, most preferably in the range of 0-1V, is typically sufficient to inhibit the partial erasure of unselected cells K, X and Y such that their threshold voltages are lowered by less than 100 mV per 100,000 accesses (which is considered a tolerable lowering of threshold voltage). These are merely typical exemplary values, and the present invention is not restricted to these values. It is noted that an inhibit voltage of 0-1V is generally sufficiently low so as not to cause any significant leakage current through the cells that receive this gate voltage.

Table C summarizes the effect of the application of the inhibit voltage (e.g., 1V) on the unselected cells when programming right-side bit 17 of cell P:

TABLE C

| Cell | Bit | $V_g$ | $V_d$ | $V_s$ | Effect on $V_t$ |
|---|---|---|---|---|---|
| P | Right | 9 | 4.5 | 0 | Program |
| K | Right | 1 | 4.5 | 0 | Minute Erase |
| Q | Left | 9 | 4.5 | 4.5 | Virtually None |

TABLE C-continued

| Cell | Bit | $V_g$ | $V_d$ | $V_s$ | Effect on $V_t$ |
|---|---|---|---|---|---|
| Q | Right | 9 | 4.5 | 4.5 | Virtually None |
| R | Both | 9 | 4.5 | 4.5 | Virtually None |
| X | Right | 1 | 4.5 | 0 | Minute Erase |
| Y | Left | 1 | 4.5 | 4.5 | Minute Erase |
| Y | Right | 1 | 4.5 | 4.5 | Minute Erase |
| Z | Both | 1 | 4.5 | 4.5 | Minute Erase |

Figure 3:
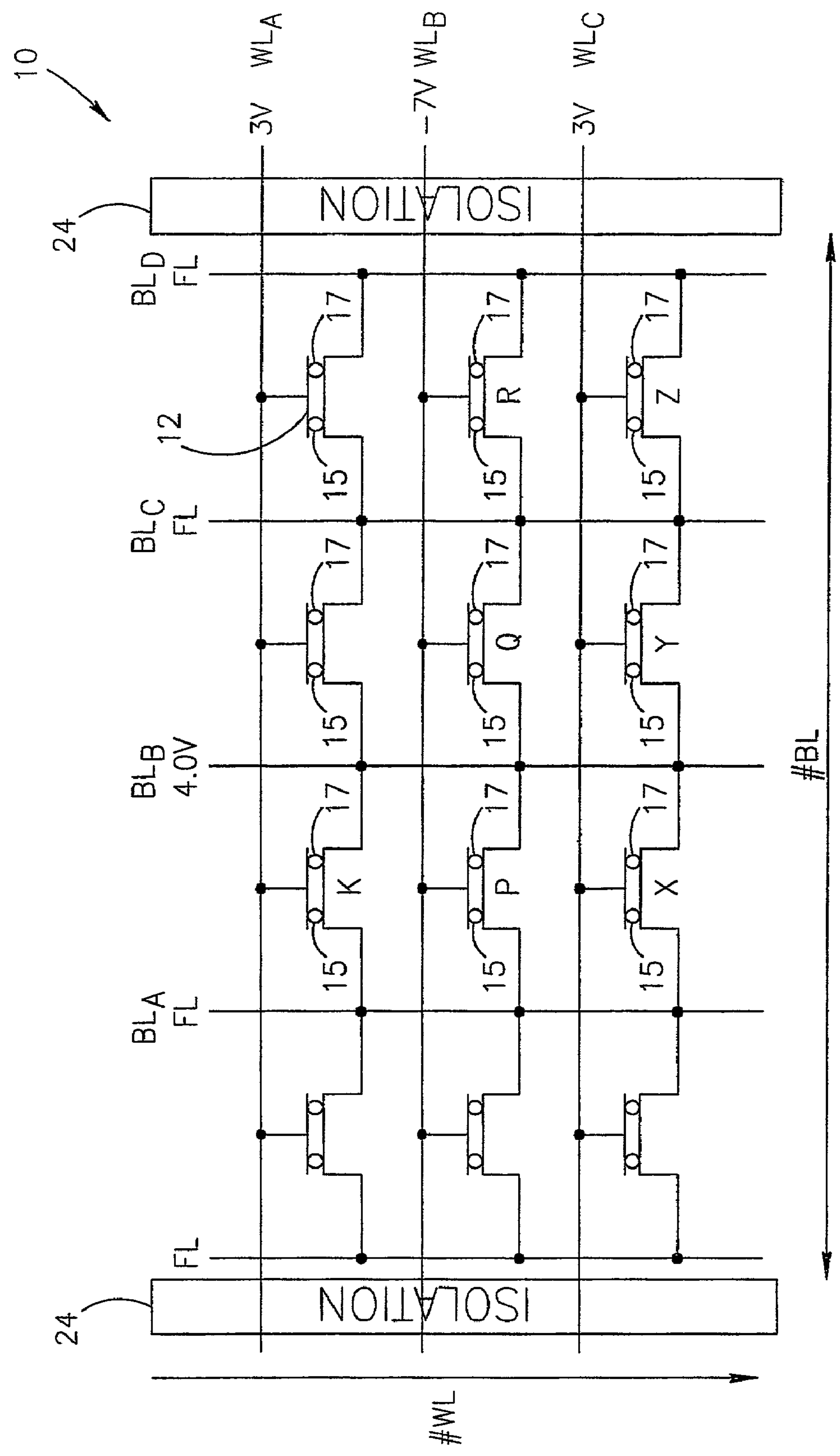

FIG. 3 illustrates one example of the invention during erasing of right-side bit 17 of cell P. As before, a gate voltage $V_g$ of −7V is applied to word line $WL_B$, a drain voltage $V_d$ of 4V is applied to bit line $BL_B$, and the remaining bit lines are floated near ground before erasing.

In order to inhibit lowering of the threshold voltage of right-side bits 17 of cells K and X, and left-side bit 15 of cell Y, a positive gate voltage is applied to word lines $WL_A$ (of cell K) and $WL_C$ (of cells X and Y). For the purposes of example only, in the case of $V_g$=−7V, $V_d$=4V, and an erasing time of 2 msec, it has been found that an inhibit voltage in the range of 2.5-4.5V, most preferably in the range of 3-4V, is typically sufficient to inhibit the partial erasure of right-side bits 17 of unselected cells K and X, and left-side bit 15 of cell Y, such that their threshold voltages are lowered by less than about 100 mV per 100,000 accesses. Again, it is noted that these are merely typical exemplary values, and the present invention is not restricted to these values.

As described hereinabove, if no inhibit voltage were to be applied to the unselected word lines, there would be no voltage propagation to the right-side bit lines of array 10, because the only gate voltage applied would be the negative gate voltage to word line $WL_B$. However, the application of the inhibit voltage of 3V, for example, to the unselected word lines may be of sufficient magnitude so as to slightly turn on the cells to the right and left of bit line $BL_B$ and cause a voltage propagation to all the bit lines of array 10. This means that the bit lines towards the right and left of bit line $BL_B$ receive a positive voltage, the magnitude of which is a function of the inhibit voltage diminished by the threshold voltage, which in turn depends upon the bulk effect of the memory transistors on those unselected bit lines. For example, for an inhibit voltage of 3V and threshold voltage of 1.5V, the bit line voltages may rise to about 1.5V. The result is that for unselected bits on unselected word lines, the combination of the positive inhibit voltage and the positive drain and source voltages causes a disturb, but of generally negligible magnitude. For unselected bits on the selected word line (to which the negative erasure voltage has been applied), the combination of the negative gate voltage and the positive drain and source voltages causes a slight disturb. In the above example, the combination of $V_g$=−7V, $V_d$=1.5V and $V_s$=1.5V, causes a slight erasure but significantly less than the combination of $V_g$=−7V, $V_d$=4V and $V_s$=1.5V on the selected bit which is erased. It is noted that since the memory transistors that propagate the bit line voltage are only slightly turned on, the extent to which the bit line voltage propagates during the erase pulse is limited.

In general, in the present invention, the application of the inhibit voltage on the unselected word lines during an erase operation significantly reduces the bit line disturb to the unselected bits, and replaces the relatively high bit line disturb with two other disturbs of a lesser magnitude:

a) a negligible disturb to unselected bits on unselected word lines, and b) a small disturb to unselected bits on the selected word line.

The presence of isolation zones 24 reduces the unwanted voltage propagation, and in doing so, prevents the spread of these two minor disturbs.

Table D summarizes the effect of the application of the inhibit voltage (e.g., 3V) on the unselected cells when erasing right-side bit 17 of cell P:

TABLE D

| Cell | Bit | $V_g$ | $V_d$ | $V_s$ | Effect on $V_t$ |
|---|---|---|---|---|---|
| P | Right | −7 | 4 | 1.5 | Erase |
| K | Right | 3 | 4 | 1.5 | Virtually None |
| Q | Left | −7 | 4 | 1.5 | Erase |
| Q | Right | −7 | 1.5 | 4 | Minute Erase |
| R | Both | −7 | 1.5 | 1.5 | Minute Erase |
| X | Right | 3 | 4 | 1.5 | Virtually None |
| Y | Left | 3 | 4 | 1.5 | Virtually None |
| Y | Right | 3 | 1.5 | 4 | Virtually None |
| Z | Both | 3 | 1.5 | 1.5 | Virtually None |

As mentioned hereinabove, the magnitude of the required inhibit voltage is a function of a number of variables, such as, but not limited to, programming time, drain voltage applied to the bit line of the programmed cell, voltage difference between gate and drain voltages applied to the selected cell, and the tolerable drop in the threshold voltage of the unselected cell.

In the NROM array of the invention, program disturb of unselected bits may also be reduced by using longer programming times and/or lower bit line voltages to complete the programming of the selected bit. Erase disturb of unselected bits may be reduced by using more negative word line voltages and/or shorter erasing times and/or lower bit line voltages to complete the erasing of the selected bit.

Figure 4:
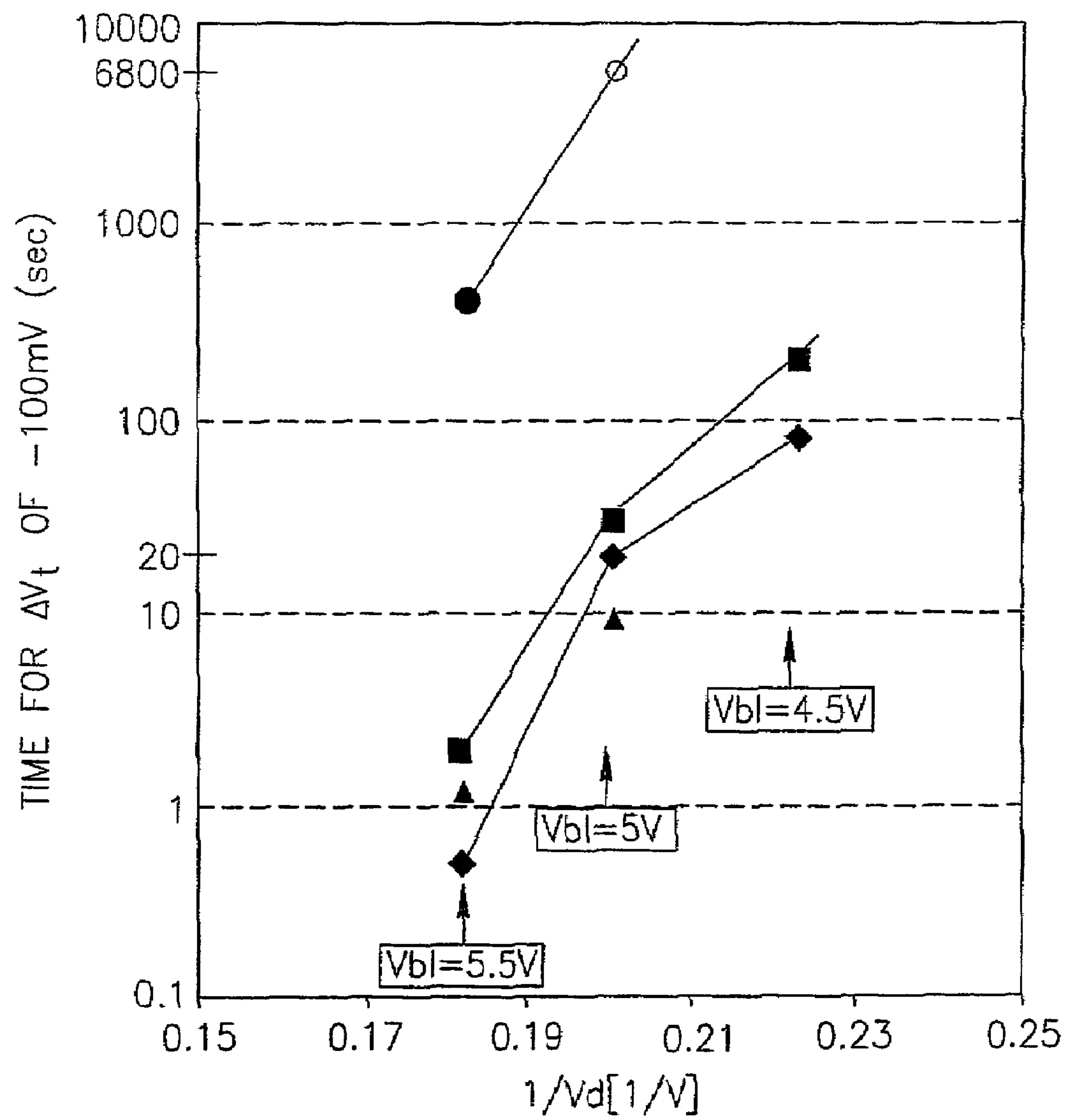
FIG. 4 is a graph illustrating the time required for the threshold voltage to drop by 100 mV as a function of the measured voltage difference between gate and drain voltages applied to the selected cell, for different operating conditions.

Reference is now made to FIG. 4, which graphically illustrates the time required for the threshold voltage to drop by 100 mV as a function of the measured voltage difference between gate and drain voltages applied to the selected cell. The lower curve of FIG. 4 (data marked by diamonds) graphically depicts the time for the threshold voltage to drop by 100 mV for the combination of $V_g$=0V and $V_s$ floating, as a function of different drain voltages. For example, for a combination of $V_d/V_g/V_s$ of 5.5/0/float (as measured in volts), it takes about 0.5 sec for the threshold voltage to drop by 100 mV. For a combination of $V_d/V_g/V_s$ of 5/0/float, it takes about 20 sec for the threshold voltage to drop by 100 mV. For a combination of $V_d/V_g/V_s$ of 4.5/0/float, it takes about 85 sec for the threshold voltage to drop by 100 mV. Thus, the time for erase disturbs to affect unselected cells is not very prolonged.

In contrast, as depicted in the upper curve of FIG. 4 (data marked by circles), for a combination of $V_d/V_g/V_s$ of 5.5/3/float, i.e., upon application of a 3V inhibit gate voltage, it takes about 460 sec for the threshold voltage to drop by 100 mV. For a combination of $V_d/V_g/V_s$ of 5/3/float, it takes about 6800 sec for the threshold voltage to drop by 100 mV. Thus, when an inhibit voltage is applied to unselected cells, the time for erase disturbs to affect the unselected cells is greatly increased. There is no appreciable lowering of the threshold voltage of the unselected cells even after a long time.

The accumulated disturb, i.e., change in threshold voltage, over many access operations, and with the application of the inhibit voltage, may be calculated for the unselected bits as follows, for all operations of erase or program:

$\Delta V_{t\ total}$ (the total change in the threshold voltage of a bit due to disturbs)=$\Delta V_{t1}$ (due to erase and program operations on the other bits residing on the same bit line)+$\Delta V_{t2}$ (due to erase and program operations on the other bits residing on other bit lines and other word lines)+$\Delta V_{t3}$ (due to erase and program operations on the other bits residing on other bit lines and on+the same word line).

The following is an illustrative example based upon Tables C and D hereinabove. The total change in the threshold voltage of the left-side bit 15 of cell Y, $\Delta V_{t\,total}$ (assuming that this bit has been previously programmed), would be the sum of:

$\Delta V_{t1}$ caused by the application of a combination of $V_d/V_g/V_s$=4.5/1/4.5 (volts) while programming any or all of the other bits on bit line $BL_B$, and $V_d/V_g/V_s$=4/3/1.5 while erasing any or all of the other bits on bit line $BL_B$, plus $\Delta V_{t2}$ caused by the application of a combination of $V_d/V_g/V_s$=4.5/1/4.5 while programming any or all of the other bits on bit lines other than $BL_B$ and on word lines other than $WL_C$, and $V_d/V_g/V_s$=1.5/3/1.5 while erasing any or all of the other bits on bit lines other than $BL_B$ and on word lines other than $WL_C$, plus $\Delta V_{t3}$ caused by the application of a combination of $V_d/V_g/V_s$=4.5/9/4.5 while programming any or all of the other bits on bit lines other than $BL_B$ and on word line $WL_C$, and $V_d/V_g/V_s$=1.5/−7/1.5 while erasing any or all of the other bits on bit lines other than $BL_B$ and on word line $WL_C$.

The accumulated disturb times are calculated as follows:

For bits on the selected bit line and unselected word lines, corresponding to $\Delta V_{t1}$, the accumulated disturb time is:

$$\tau_{disturb}=\tau_{operation}N_{WL}\phi$$

wherein $\tau_{disturb}$ is the accumulated disturb time, $\tau_{operation}$ is the average time duration of performing operation (erase or program), $N_{WL}$ is the number of word lines in the array and $\phi$ is the number of times cell is accessed.

For bits on unselected bit lines and unselected word lines, corresponding to $\Delta V_{t2}$, the accumulated disturb time is:

$$\tau_{disturb}=\tau_{operation}N_{WL}N_{BL}\phi$$

wherein $N_{BL}$ is the number of bit lines in the array.

For bits on unselected bit lines and on the selected word line, corresponding to $\Delta V_{t3}$, the accumulated disturb time is:

$$\tau_{disturb}=\tau_{operation}N_{BL}\phi$$

It will be appreciated by persons skilled in the art that the present invention is not limited by what has been particularly shown and described herein above. Rather the scope of the invention is defined by the claims that follow:

What is claimed is:

1. A method for operating an electrically erasable programmable read only memory (EEPROM) array of non-volatile memory ("NVM") cells having one or more charge storage regions, said method comprising: mitigating disturb effect during an erase operation by selecting one of said memory cells; and erasing a bit of the selected memory cell while substantially concurrently applying an inhibit word-line voltage to a terminal of an unselected memory cell in proximity with the selected memory cell, such that the inhibit voltage mitigates disturb effect on the unselected cell.

2. The method according to claim 1 wherein said memory cells comprise non-floating gate memory cells.

3. The method according to claim 2, wherein said cells comprise one or more charge storage regions per cell and each charge storage region is associated with one or more bits.

4. The method according to claim 3, wherein a charge storage region may be charged to one of three or more charge levels, wherein each of the three or more charge levels is associated with a different logical state.

5. The method according to claim 4, wherein either the selected or unselected cell is operated as a multi-level cell.

6. The method according to claim 1 wherein said memory cells are nitride read only memory (NROM) cells.

7. The method according to claim 6, wherein said cells comprise one or more charge storage regions per cell and each charge storage region is associated with one or more bits.

8. The method according to claim 7, wherein a charge storage region may be charged to one of three or more charge levels, wherein each of the three or more charge levels is associated with a different logical state.

9. The method according to claim 8, wherein either the selected or unselected cell is operated as a multi-level cell.

10. The method according to claim 1, wherein said array is a virtual ground array.

11. The method according to claim 1, wherein said unselected memory cell shares the same bit line as said selected cell.

12. The method according to claim 1, wherein said inhibit gate voltage is of such magnitude that a threshold voltage of said unselected memory cell is lowered not more than a predetermined amount.

13. The method according to claim 1 and further comprising having at least one column of said memory cells located between a pair of isolation zones.

14. A device comprising: an electrically erasable programmable read only memory (EEPROM) array of non-volatile memory ("NVM") cells having one or more charge storage regions, and a controller adapted to mitigate disturb effect during an erase operation by selecting one of said memory cells, and applying an erase pulse to a bit of the selected memory cell while substantially concurrently applying an inhibit word-line voltage to a terminal gate of an unselected memory cell in proximity with the selected memory cell, such that the inhibit voltage mitigates disturb effect on the unselected cell.

15. The device according to claim 14, wherein said memory cells comprise nonfloating gate memory cells.

16. The device according to claim 15, wherein said cells comprise one or more charge storage regions per cell and each charge storage region is associated with one or more bits.

17. The device according to claim 16, wherein a charge storage region may be charged to one of three or more charge levels, wherein each of the three or more charge levels is associated with a different logical state.

18. The device according to claim 17, wherein either the selected or unselected cell is operated as a multi-level cell.

19. The device according to claim 14, wherein said memory cells are nitride read only memory (NROM) cells.

20. The device according to claim 19, wherein said cells comprise one or more charge storage regions per cell and each charge storage region is associated with one or more bits.

21. The device according to claim 20, wherein a charge storage region may be charged to one of three or more charge levels, wherein each of the three or more charge levels is associated with a different logical state.

22. The device according to claim 21, wherein either the selected or unselected cell is operated as a multi-level cell.

* * * * *